United States Patent [19]

Seidler

[11] Patent Number: 4,669,535

[45] Date of Patent: Jun. 2, 1987

[54] HEAT SINK FORMED OF STACKED FIN ELEMENTS

[75] Inventor: Jack Seidler, Flushing, N.Y.

[73] Assignee: North American Specialties Corp., Flushing, N.Y.

[21] Appl. No.: 763,352

[22] Filed: Aug. 7, 1985

[51] Int. Cl.[4] .................................................. F28F 7/00
[52] U.S. Cl. ....................................... 165/78; 165/185; 29/157.3 B
[58] Field of Search .................... 165/185, 183, 78; 122/367; 29/157.3

[56] References Cited

U.S. PATENT DOCUMENTS

| | | | |
|---|---|---|---|
| 851,977 | 4/1907 | Bigsby et al. | 165/183 |
| 2,396,216 | 3/1946 | Vang | 165/185 |
| 3,081,824 | 3/1963 | Macall | 165/185 |
| 3,312,277 | 3/1965 | Chitouras et al. | 165/185 |
| 3,448,798 | 6/1969 | Coe | 165/183 |
| 4,022,272 | 5/1977 | Miller | 165/78 X |
| 4,143,711 | 3/1979 | Beitner | 165/185 |
| 4,498,530 | 2/1985 | Lipschutz | 165/185 |

*Primary Examiner*—William R. Cline
*Assistant Examiner*—Richard R. Cole
*Attorney, Agent, or Firm*—Darby & Darby

[57] ABSTRACT

A heat sink is formed of an interlocked stack of strip elements each having a heat-conducting base portion and a thinner heat-radiating fin portion, the base portions being configured for interlocking engagement to form a unitary heat-conductive mass and the fin portions having relative large surface areas for efficient heat disposition into surrounding air.

10 Claims, 4 Drawing Figures

HEAT SINK FORMED OF STACKED FIN ELEMENTS

BACKGROUND OF THE INVENTION

The present invention relates to an improved heat sink for use with electronic circuitry.

It is often necessary to achieve dissipation of undesired heat evolved in electronic circuitry. This has been accomplished by use of heat sinks made in a wide assortment of shapes and sizes. Such sinks generally include a metal base closely associated with the electronic part producing the undesired heat, and numerous cooling fins extending therefrom, generally of the same material as that of the base. In the past, relatively large one-piece heat sinks, of the base plate-cooling fin type, have been produced by casting or machining metal into a particular shape and size needed.

With the advent of miniaturized electronic circuitry, with components more densely packed in smaller volumes, it has become necessary to develop heat sinks which are both sufficiently small to conform to the size constraints accompanying miniaturization, and capable of carrying off adequate amounts of heat. Since large accumulation of heat is produced in a small region as a result of the densely packed circuitry, the requirements for adequate heat dissipation therefrom are difficult to meet.

Relatively small heat sinks have generally been made by forming a base plate, and then soldering or brazing independently fabricated metal cooling fins to the base. This method of assembly is costly and becomes more difficult as smaller heat sink sizes are contemplated. Moreover, the utilization of a base plate, separate from cooling fins, reduces the efficiency of heat dissipation by the heat sink, since the heat is not transmitted directly from the base plate to the cooling fin, but must first traverse a brazed or soldered joint which joins the two components, and may offer increased impedance to heat flow. Such diminished heat conductivity of course reduces the efficicacy of the heat sink.

The present invention is intended to obviate these disadvantages.

DESCRIPTION OF THE INVENTION

It is an object of the present invention to provide a relatively inexpensive heat sink which is formed of a plurality of one-piece units each including a base and integral cooling fin, and suitable for use in miniaturized electronic circuitry.

According to one aspect of the present invention, a heat sink is built up by stacking or laminating a set of heat-conductive (e.g., copper or other metal) strips or similar elements in a simple manner adapted for ready assembly. Each strip is formed of a base portion integral with a heat-dissipating fin portion having a relatively large surface area for heat-exchange with surrounding air. After assembly, the base portions are adapted to interlock and the base portions are closely merged to form an essentially solid mass which is formed or otherwise adapted to be placed in close proximity to the source of heat to be dissipated. The heat flow thus passes directly from the source to the base, and thence outward to the fins for dissipation into surrounding air, without having to close boundaries of different materials or gaps which might offer higher resistance to heat flow and thereby impede the heat dissipation.

Moreover, the stacked elements are designed to be readily and inexpensively fabricated, by continuous manufacturing techniques, from continuous strip material, by contouring the cross-section of the strip, as by milling, coining, skiving, rolling or other continuous processes. The strip elements to be interlocked and stacked may thereafter be cut, in suitable lengths as may be desired, from the continuous formed strip material.

The invention is more fully described with reference to the accompanying drawing in which.

Figure 1:
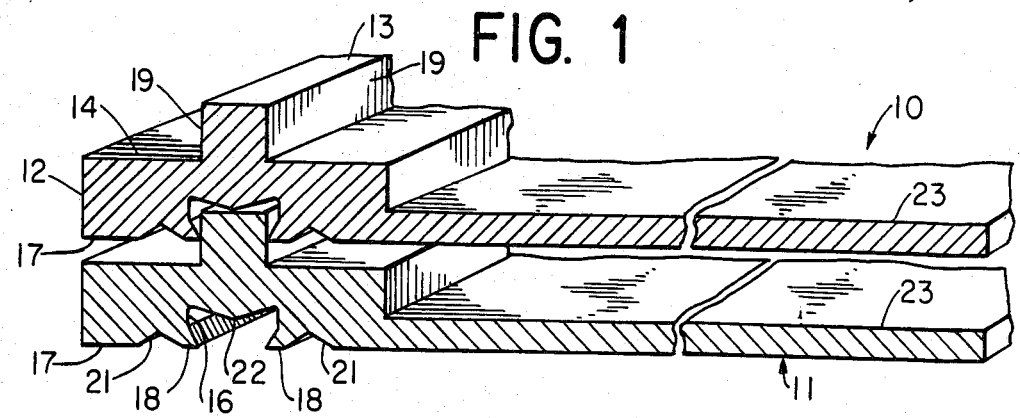
FIG. 1 is a cross-sectional view of two continuous strip elements of contoured metal which are shown superimposed one above the other just prior to joining them.

FIG. 1 shows two strip elements 10,11 of metal which have been formed to have the cross-section shape depicted therein, as by milling, rolling, skiving, coining or other processes. Each strip element 10,11 is formed to have at one edge a relatively short and wide base portion 12 having a longitudinal projection, such as a rib or ridge 13, extending along its upper surface 14 and a corresponding groove or elongated recess 16 in its lower surface 17, opposite to the rib 13. The groove 16 has a width slightly larger than that of rib 13, and a depth approximating that of the rib height. In general, the cross-sectional area of the groove 16 should desirably approximate the cross-sectional area of the rib 16, since as shown below the groove 16 is intended to accommodate and interlock with the rib 13. This arrangement forms a contoured base portion. The edge of each strip 10,11 opposite to the contoured base portion is formed into a thin flat fin 23, having a thickness which is a fraction e.g. one-half) of the thickness of the base portion 12. If desired, these fins may be curved (in a manner not shown in the drawing) so as to remain substantially parallel to the fins of superposed other strip elements. Also, the fins 23 may be ribbed transversely for greater rigidity where desired. Preferably, however, the base portion and fin portions are essentially co-planar.

According to one aspect of the invention, the rib 13 and groove 16 are mutually formed to interlock and permit assembly with adjoining strip elements stacked thereon such that stacked and joined base portions form substantially a solid block of material, which may be juxtaposed to the heat source to lead heat efficiently from the source into the block.

In a preferred embodiment, as shown in FIG. 1, the groove 16 is formed to have a pair of inwardly protruding edges 18 spaced substantially by the same distance as the width of the rib 13, which in turn is formed to have parallel sides 19 extending upwardly from the upper surface 14 of base portion 12. These sides 19 thus can pass between the inwardly protruding edges 18 when two strip elements 10,11 are superposed, as shown in FIG. 1. The edges 18 may be formed by rolling, coining or staking an auxiliary groove 21 into the lower surface 17 of base portion 12, just outwardly of and on each side of main groove 16, so as to force some of the material into the groove 16 at edge 18.

Figure 2:
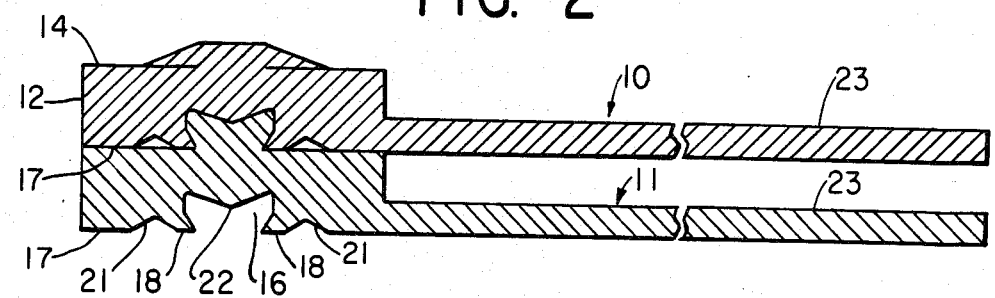
FIG. 2 is a similar view of the strip elements of FIG. 1 in an assembled state.

The base of groove 16, shown as its upper surface in FIG. 1, is formed with an inwardly protruding ridge 22 substantially at its center and extending into the groove 16 more than the rest of the upper surface of the groove. Thus, upon stacking several strip elements 10 with the rib 13 of one extending into the groove 16 of an adjacent strip element, the flat top surface of rib 13 will engage ridge 22. By compressing the strip elements together, the ridge 22 will tend to cause the edges 16 to hug closely the side surfaces of the rib 13. At the same time, the corners of the rib 13 are forced outwardly by ridge 22, so that an interlocked unitary mass of material is formed as shown in FIG. 2, which holds the base portions rigidly together to form the base of the heat sink. The fin portions 23 (whether flat or curved out of the respective planes of the base portions 12) then are substantially parallel to one another, and form relatively large radiating surfaces in contact with ambient air over a relatively large area for conducting heat away from the base portions 12 and dissipating the heat into the air in contact with the large area fin surfaces.

Thus, in one embodiment, the present invention relates to a plurality of identical, continuous strips of metal as depicted in FIG. 1 superimposed so that the protruding rib of each subjacent strip is interlocked with the groove located at the lower edge of the superimposed strip.

This arrangement is particularly advantageous in mass production of highly effective heat sinks for miniaturized electronic components or other heat sources. The mass of joined contoured base portions may occupy a volume suited to the size of the heat source, and will provide optimum thermal conductivity in acting as a base for the heat sink. The fin portion of each strip is highly effective in providing heat dissipation, and thus functions as a cooling fin.

The device of the present invention may also be readily dimensioned to be fabricated by established processes into miniaturized heat sinks. For example, the contoured base portion 12 of each strip 10 may have a thickness of about 0.010 inches, and may be fabricated from strip material of a total thickness of 0.017 inch to form a rib of about 0.007 inch in height. The fin portion may have a thickness of about 0.004 inch with a spacing between fins of about 0.006 inch. Each fin may have a lateral extent (i.e., horizontal extent in FIG. 1) of any desired size, determined only by the overall width of the strip material used to satisfy the needed radiating surface area. Similarly, the length of each strip element 10,11 (perpendicular to the plane of FIG. 1) may be chosen in correspondence to the size of the heat source, or as desired. The contoured base portion may have a horizontal extent of the order of 0.040 inch, with rib 13 having a width and height of the order of 0.005 inch. These dimensions are of course to be deemed illustrative only, and may be varied as needed or desired for the design at hand. However, they indicate the degree of miniaturization available by the present invention.

In manufacture, a flat strip of appropriate thickness and width will be contoured in the manner described above. This may be done by continuous processes, resulting in a contoured-strip roll or reel.

Strip elements of desired length are cut from the contoured-strip roll, and a desired number are then stacked, with the rib of one entering the groove of an adjacent element. The application of pressure to the entire stack will then compress the stack in the manner described, to form a solid interlocked block suitable for the base of a heat sink.

Thus, a heat sink is provided of any desired height (formed by stacking a desired number of strip elements), of any desired length (determined by the length to which the strip elements are cut), and any desired radiating surface area (permitted by selection of desired lateral extent of the fins 23). This heat sink is capable of expeditious fabrication by automatic machinery, in miniature sizes while retaining good heat conductivity and dissipation.

Figure 3:
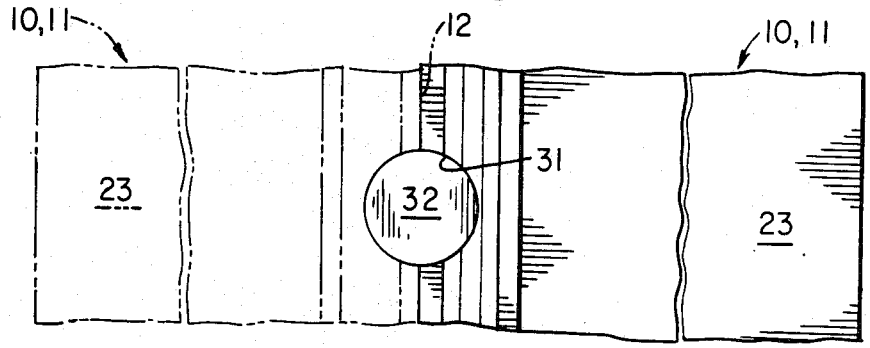
FIG. 3 is a plan view of a completed heat sink according to the invention.
Figure 4:
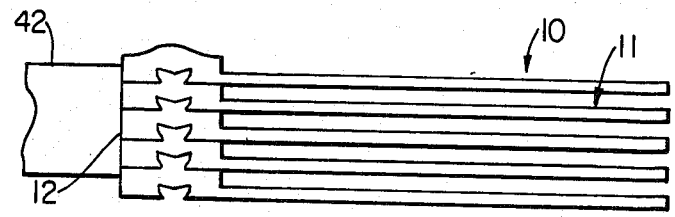
FIG. 4 is a side elevation view of a heat sink according to the invention, associated with a source of heat to be dissipated.

Concurrently with cutting the strip elements from the strip roll, the base portions may be stamped or otherwise formed into a shape suitable to make good contact with the heat source. Thus, as shown in FIG. 3, an arcuate cutout 31 may be formed in the strip element 10, to accommodate closely a heat source schematically indicated at 32. These cutouts may be formed either on individual strip elements before joining the strip elements into the the sink, or after the strip elements were assembled into the heat sink. A second heat sink, shown in phantom lines to the left of source 32, may additionally be wired, effectively to surround source 32 by the two bases 12 for more effective heat dissipation. Alternatively, as shown in FIG. 4, one or more heat sinks may be juxtaposed to a side of a heat source 42 to dissipate the source heat.

While the ribs 13 are shown as rectangular in cross-section, it will be understood that other cross-sectional shapes may be used, to provide interlocking engagement with the groove 16.

Also, although a single rib and groove are shown for each strip element, in the case of relatively wide base portions, two or more ribs may be provided parallel to one another on one surface of the base portion together with a corresponding number of grooves in the opposite surface of the base portion.

It is to be understood that various modifications of the foregoing embodiment of the invention may be made without departure from the essential spirit thereof.

What is claimed as the invention is:

1. A strip element adapted for stacking to form a heat sink by being compressed together with like elements, comprising:
   a contoured base portion having a projection extending longitudinally along one surface and a groove extending longitudinally along an opposed surface; and
   said projection being significantly narrower than said groove and extending outwardly from said base portion by a distance significantly greater than the depth of said groove, said groove having a side wall portion projecting toward an opposite side wall; and
   a fin portion thinner than said base portion and extending laterally from the base portion whereby upon stacking said element base portions of a number of said elements with the projection of one element engaged in the groove of an adjacent element and compressing said elements together, said elements mechanically interlock to form a unitary mass adapted efficiently to serve as a heat sink for conducting heat away from a component juxtaposed thereto.

2. A strip element as defined in claim 1 wherein said projection is substantially rectangular in cross-section.

3. An element as defined in claim 1 where each side of said groove has an inwardly projecting portions along its length, said portions having a spacing at least equal to the width of said projection.

4. A strip element as in claim 1 wherein said groove has an inwardly projecting ridge extending along the bottom of said groove and adapted to engage the top surface of said projection.

5. A strip element as in claim 1 wherein the cross-sectional area of said projection is substantially equal to that of said groove.

6. A heat sink comprising at least three strip elements as in claim 1.

7. A method of producing a heat sink adapted for use with miniaturized electronic components comprising the steps of
   providing a plurality of heat-conducting strip elements as in claim 1,
   stacking said strips with the groove of each except an end one engaging a projection of an adjoining element,
   each groove having a ridge at the base thereof in a position to be juxtaposed to the top of the projection of the adjoining element, and
   pressing said stack of elements together, so that said ridge forces material of said projection sideways to engage the sides of the groove with which said projection is engaged.

8. A method of producing a heat sink adapted for use with miniaturized electronic components comprising the steps of
   providing a plurality of heat-conducting strip elements as in claim 1,
   stacking said strips with the groove of each except an end one engaging a projection of an adjoining element, and
   pressing said stack of elements together, including forcing material in said projection sideways to engage the sides of the groove with which said projection is engaged.

9. An element as in claim 1,
   said projection having substantially parallel sides, and
   said groove having an inwardly projecting portion along its length on each side, said portions being spaced a distance at least substantially equal to the spacing between said projection sides.

10. A heat sink adapted for use with miniaturized electronic components comprising a plurality of stacked heat conducting strip elements as defined in Claim 1,
    the base portions of successive elements being interlocked in a stacked array with each projection except the top one engaged with the respective groove of an adjacent element base portion,
    and said base portions being compressed so that the material of a projection flows within and substantially fills the groove with which it is engaged,
    to form a heat sink base adapted to conduct heat away from a circuit component juxtaposed thereto, whereby said fin portions may efficiently dissipate such heat to the air surrounding and between said fin elements.

* * * * *